(12) United States Patent
Tsuji et al.

(10) Patent No.: US 8,629,410 B2
(45) Date of Patent: Jan. 14, 2014

(54) CHARGED PARTICLE RADIATION DEVICE

(75) Inventors: Hiroshi Tsuji, Hitachinaka (JP); Kouji Ishiguro, Hitachinaka (JP); Ichiro Tachibana, Hitachinaka (JP); Naomasa Suzuki, Hitachinaka (JP); Katsunori Onuki, Hitachi (JP)

(73) Assignee: Hitachi High-Technologies Corporation, Tokyo (JP)

( * ) Notice: Subject to any disclaimer, the term of this patent is extended or adjusted under 35 U.S.C. 154(b) by 53 days.

(21) Appl. No.: 13/378,827

(22) PCT Filed: Jun. 3, 2010

(86) PCT No.: PCT/JP2010/003698
§ 371 (c)(1),
(2), (4) Date: Dec. 16, 2011

(87) PCT Pub. No.: WO2010/146790
PCT Pub. Date: Dec. 23, 2010

(65) Prior Publication Data
US 2012/0091362 A1  Apr. 19, 2012

(30) Foreign Application Priority Data

Jun. 19, 2009  (JP) .................................. 2009-145920

(51) Int. Cl.
*H01J 37/20* (2006.01)
(52) U.S. Cl.
USPC ............... 250/441.11; 250/442.11; 250/522.1
(58) Field of Classification Search
USPC .............................. 250/522.1, 441.11, 442.11
See application file for complete search history.

(56) References Cited

U.S. PATENT DOCUMENTS

| 4,945,247 A | * | 7/1990 | Kawasaki et al. | 250/423 F |
| 5,140,164 A | * | 8/1992 | Talbot et al. | 250/492.2 |
| 5,325,708 A | * | 7/1994 | De Simon | 73/40.7 |

(Continued)

FOREIGN PATENT DOCUMENTS

| JP | 09-190791 | 7/1997 |
| JP | 2001-076660 | 3/2001 |

(Continued)

OTHER PUBLICATIONS

International Search Report from International Application PCT/JP2010/003698 mailed Jun. 29, 2010.

*Primary Examiner* — David A Vanore
*Assistant Examiner* — Wyatt Stoffa
(74) *Attorney, Agent, or Firm* — Brundidge & Stanger, P.C.

(57) ABSTRACT

Disclosed is a high resolution and high throughput charged particle radiation device that attenuates the natural vibration of an ion pump in a short time, excited by a reaction force at the time of driving the stage, and prevents occurrence of a loop of force and a loop of current. The charged particle radiation device includes a sample chamber (4) for disposing a sample (3) therein, a charged particle radiation optical lens tube (1) for irradiating the sample (3) with charged particle radiation (10), ion pumps (2a, 2b) for evacuating the charged particle radiation optical lens tube (1), a frame (16) fixedly attached to the sample chamber (4), the frame (16) facing one end of each of the ion pumps (2a, 2b), and vibration absorbers provided between the frame (16) and the one end of each of the ion pumps (2a, 2b), each of the vibration absorbers including a layered structure which includes a viscoelastic sheet (20a, 20b) sandwiched between metal plates (18a, 18b, 21a, 21b).

6 Claims, 10 Drawing Sheets

(56) References Cited

U.S. PATENT DOCUMENTS

| | | | |
|---|---|---|---|
| 7,247,848 B2 * | 7/2007 | Nakasuji et al. | 250/306 |
| 8,101,924 B2 * | 1/2012 | Hamochi | 250/442.11 |
| 2002/0166964 A1 * | 11/2002 | Talbot et al. | 250/307 |
| 2003/0189177 A1 * | 10/2003 | Hazelton | 250/442.11 |
| 2005/0205809 A1 * | 9/2005 | Uchida | 250/492.22 |
| 2006/0231773 A1 * | 10/2006 | Katagiri et al. | 250/492.1 |
| 2007/0102650 A1 * | 5/2007 | Katagiri et al. | 250/492.3 |
| 2008/0315122 A1 | 12/2008 | Katagiri et al. | |
| 2009/0173888 A1 * | 7/2009 | Shichi et al. | 250/397 |
| 2012/0193550 A1 * | 8/2012 | Tsuji et al. | 250/396 R |

FOREIGN PATENT DOCUMENTS

| | | |
|---|---|---|
| JP | 2007-157682 | 6/2007 |
| JP | 2008-052946 | 3/2008 |
| JP | 2008-052947 | 3/2008 |
| JP | 2008052947 A * | 3/2008 |
| JP | 2009-004112 | 1/2009 |

* cited by examiner

SHEAR STRAIN $\gamma = X/T = \tan\theta \fallingdotseq \theta$ ($\theta$: SMALL)

FIG. 5B $\tau = G^* \cdot \gamma$
$G^*$: COMPLEX SHEAR ELASTIC MODULUS

CHARGED PARTICLE RADIATION DEVICE

TECHNICAL FIELD

The present invention relates to a charged particle radiation device, and in particular, to a charged particle radiation device provided with an ion pump.

BACKGROUND ART

In a charged particle radiation device, such as a scanning electron microscope, a transmission electron microscope, and a semiconductor inspection device, a sample is irradiated with charged particle radiation (an electron beam) generated in an ultra-high vacuum environment inside an electron optical lens tube, and a secondary electron, a reflection electron, or a transmission electron from the sample is detected, thereby acquiring an observation image of the sample. If the electron optical lens tube is vibrated, this will cause a change in a position of the electron beam irradiation to the sample, so that strain occurs to the observation image, and the edge of a pattern is seen as vibrating, or in the case of adding up the plurality of observation images, the edge of an image after addition will turn faint. For this reason, vibration of the electron optical lens tube will invite deterioration in picture quality of the observation image, and further, this will create a factor that will induce deterioration in resolution of the charged particle radiation device.

The semiconductor inspection device is a device for observing a defect occurring to a pattern of a semiconductor device subjected to exposure on a wafer, and classifying the defects by a defect type. Meanwhile, progress has lately been made in respect of miniaturization of the semiconductor device, increase in the diameter of a sample, and higher throughput. The electron optical lens tube is vibrated due to vibration of an ion pump that can be regarded as an added mass of the electron optical lens tube after stoppage of movement of a stage on which a sample is placed, thereby raising a possibility of causing deterioration in the picture quality. Accordingly, in order to implement further enhancement in throughput, it is necessary to quickly attenuate the natural vibration of the ion pump immediately after the stage is moved to an observation position.

Meanwhile, when attention is focused on a high-polymer vibration dampening material that has lately been introduced, a viscoelastic material high in dissipation factor and loss shear modulus has been developed.

In Patent Document 1 and Patent Document 2, respectively, a technology is disclosed for attenuating and blocking vibration propagating to an electron optical lens tube by use of a damper made of a viscoelastic material. In the case of the technology described in Patent Document 1, a damper is interposed between a yoke and a case, making up an ion pump, and between the case and a magnet, respectively. Accordingly, there exists a problem that the ion pump becomes complex in structure and baking becomes difficult to apply because a viscoelastic damper that will be cured by heating is disposed inside the ion pump. In the case of the technology described in Patent Document 2, a damper is interposed between a pedestal of a beam application device (a transmission electron microscope) and the floor. Accordingly, it is possible to block vibration propagated from the floor. However, there exists a problem that an advantageous effect of from the device itself, such as vibration occurring due to movement of a stage, cannot be expected.

PRIOR ART DOCUMENTS

Patent Documents

Patent Document 1: Japanese Patent Application Publication No. 2008-52946
Patent Document 2: Japanese Patent Application Publication No. 2008-52947

DISCLOSURE OF THE INVENTION

Problem to be Solved by the Invention

In order to evacuate the electron optical lens tube to an ultra-high vacuum, the ion pump is connected with the electron optical lens tube through the intermediary of a flange. When the stage is moved, a reaction force at the time of driving and at the time of stoppage will act on a sample chamber, whereupon the natural vibration of the ion pump cantilevered by the electron optical lens tube will be excited. Further, because an attenuation factor hardly exists in a flange connector between the ion pump and the electron optical lens tube, damping time of vibration is long.

Figure 2:
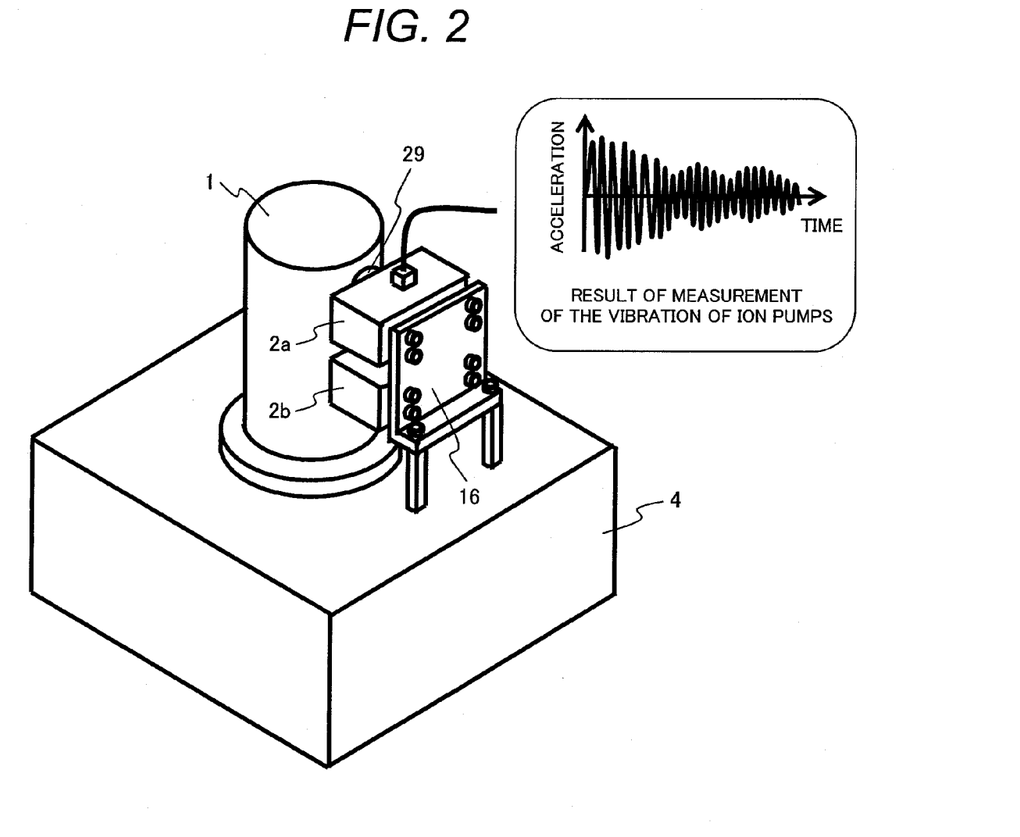
FIG. 2 shows an example in which ion pumps are attached to a charged particle radiation device according to a conventional technology.

In FIG. 2, an example is shown in which ion pumps are attached to a charged particle radiation device according to a conventional technology. Each of the ion pumps 2a and 2b has one side connected with an electron optical lens tube 1 through the intermediary of a flange 29, having the opposite side connected with a frame 16 by use of bolts. The frame 16 is fixedly attached to a sample chamber 4. FIG. 2 also shows a result of measurement of the vibration of the ion pumps. The result of the measurement is intended to find variation in the vibration (acceleration) of the ion pumps, over time, after movement of the stage is stopped. Since the frame 16 is fixedly attached to the sample chamber 4, respective vibrations of the ion pumps 2a and 2b are suppressed in amplitude. However, as shown in the result of the measurement of the vibration of the ion pumps, there occurs a swell owing to a difference in the natural frequency between different vibration modes, resulting in slow attenuation.

As described above, the electron optical lens tube undergoes vibration owing to the natural vibration of the ion pump, thereby causing deterioration in the picture quality of the observation image and deterioration in the resolution of the charged particle radiation device. It is conceivable to wait for attenuation of the vibration, however, it takes long time for the vibration to attenuate to an extent that the picture quality is not adversely affected, so that this will invite deterioration in throughput.

Further, if the sample chamber, the electron optical lens tube, and the frame are made of a dissimilar material, respectively, this will cause a loop of force to be formed by the sample chamber, the frame, the ion pump, and the electron optical lens tube. If thermal stress occurs to each of those members due to a change in temperature, a force from the frame will act on the electron optical lens tube by the agency of the loop of force, thereby causing a change in the position of the irradiation with the electron beam (charged particle radiation), so that this is undesirable.

Further, if the sample chamber, the electron optical lens tube, and the frame are made of an electrically conductive material, this will cause a loop circuit of current to be formed by the sample chamber, the frame, the ion pump, and the electron optical lens tube. Upon the occurrence of the loop of current, an earth potential will change, thereby creating a factor that causes a change in the position of the irradiation with the electron beam (charged particle radiation).

Figure 3:
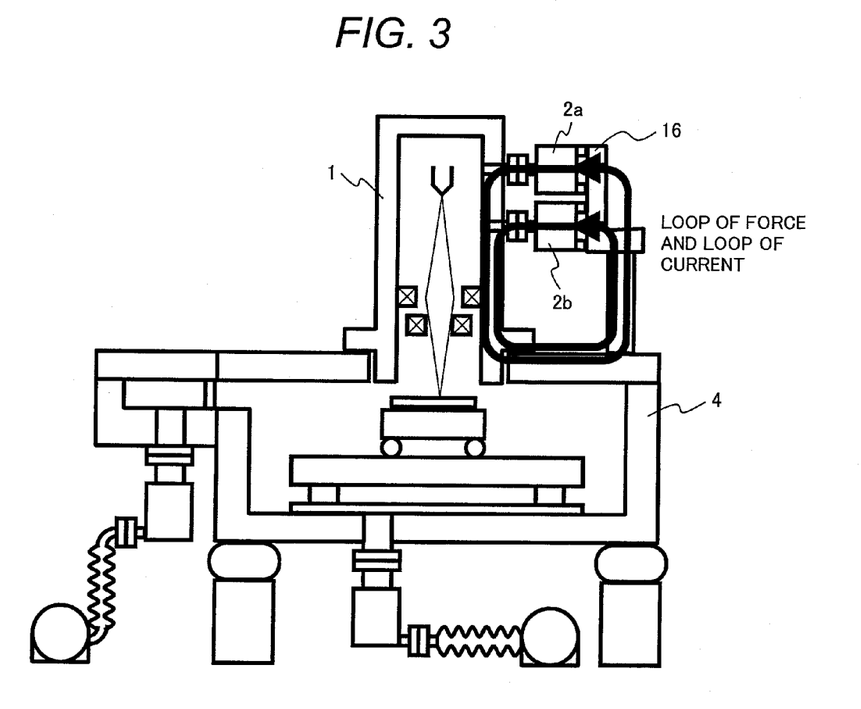
FIG. 3 shows a loop of force and a loop of current, occurring to the charged particle radiation device.

FIG. 3 shows the loop of force and the loop of current, occurring to the charged particle radiation device. The loop of force and the loop of current, which are formed by the ion pumps 2a and 2b, the electron optical lens tube 1, the sample chamber 4, and the frame 16, create the factor that causes a change in the position of the irradiation with the electron beam (charged particle radiation). Due to the change in the position of the irradiation with the electron beam (charged particle radiation), the picture quality of the observation image undergoes deterioration, and further, deterioration occurs in the resolution of the charged particle radiation device.

A problem to be solved by the present invention is to attenuate the natural vibration of the ion pump in a short time, excited by the reaction force at the time of driving the stage, and to prevent the occurrence of the loop of force and the loop of current. It is therefore an object of the invention to solve the problem and to provide a charged particle radiation device which has a high resolution and a high throughput.

Means for Solving the Problem

To solve the problem, a charged particle radiation device according to the invention has the following configuration.

A charged particle radiation device includes a sample chamber for disposing a sample therein, a charged particle radiation optical lens tube for irradiating the sample with charged particle radiation, an ion pump for evacuating an interior of the charged particle radiation optical lens tube, a frame fixedly attached to a constituent member of the sample chamber, the frame facing one end of the ion pump, and a vibration absorber provided between the frame and the one end of the ion pump, the vibration absorber including a layered structure which includes a viscoelastic sheet sandwiched between metal plates.

The charged particle radiation device may include the plurality of the ion pumps. The frame is split into plural frames, the number of the split frames corresponding with the number of the ion pumps. Each of the split frames is fixedly attached to a constituent member of the sample chamber or to another frame (a frame other than the said frame). The layered structure is provided between each of the split frames and each of the ion pumps.

Further, a charged particle radiation device according to the invention can have the following configuration as well.

A charged particle radiation device includes a sample chamber for disposing a sample therein, a load plate for supporting the sample chamber, a charged particle radiation optical lens tube for irradiating the sample with charged particle radiation, an ion pump for evacuating an interior of the charged particle radiation optical lens tube, a frame fixedly attached to the load plate, the frame facing one end of the ion pump, and a vibration absorber provided between the frame and the one end of the ion pump, the vibration absorber including a layered structure which includes a viscoelastic sheet sandwiched between metal plates.

The charged particle radiation device may include the plurality of the ion pumps. The frame is split into plural frames, the number of the split frames corresponding with the number of the ion pumps. Each of the split frames is fixedly attached to the load plate or to another frame (a frame other than the said frame). The layered structure is provided between each of the split frames and each of the ion pumps.

Advantageous Effect of the Invention

In the charged particle radiation device according to the invention, it is possible to attenuate the natural vibration of the ion pump after movement of the stage in a short time, and to prevent the occurrence of the loop of force and the loop of current. As a result, an observation image high in resolution can be acquired at a high speed.

DESCRIPTION OF EMBODIMENTS

In a charged particle radiation device according to the invention, charged particle radiation is an electron beam or an ion beam. In embodiments of the invention, described hereunder, a charged particle radiation device for irradiating a sample with an electron beam is taken as an example. However, it is to be understood that the invention is also applicable to a charged particle radiation device for irradiating a sample with an ion beam.

Prior to development of the invention, measurements were made on the natural vibration modes of an ion pump in a charged particle radiation device.

Figure 4:
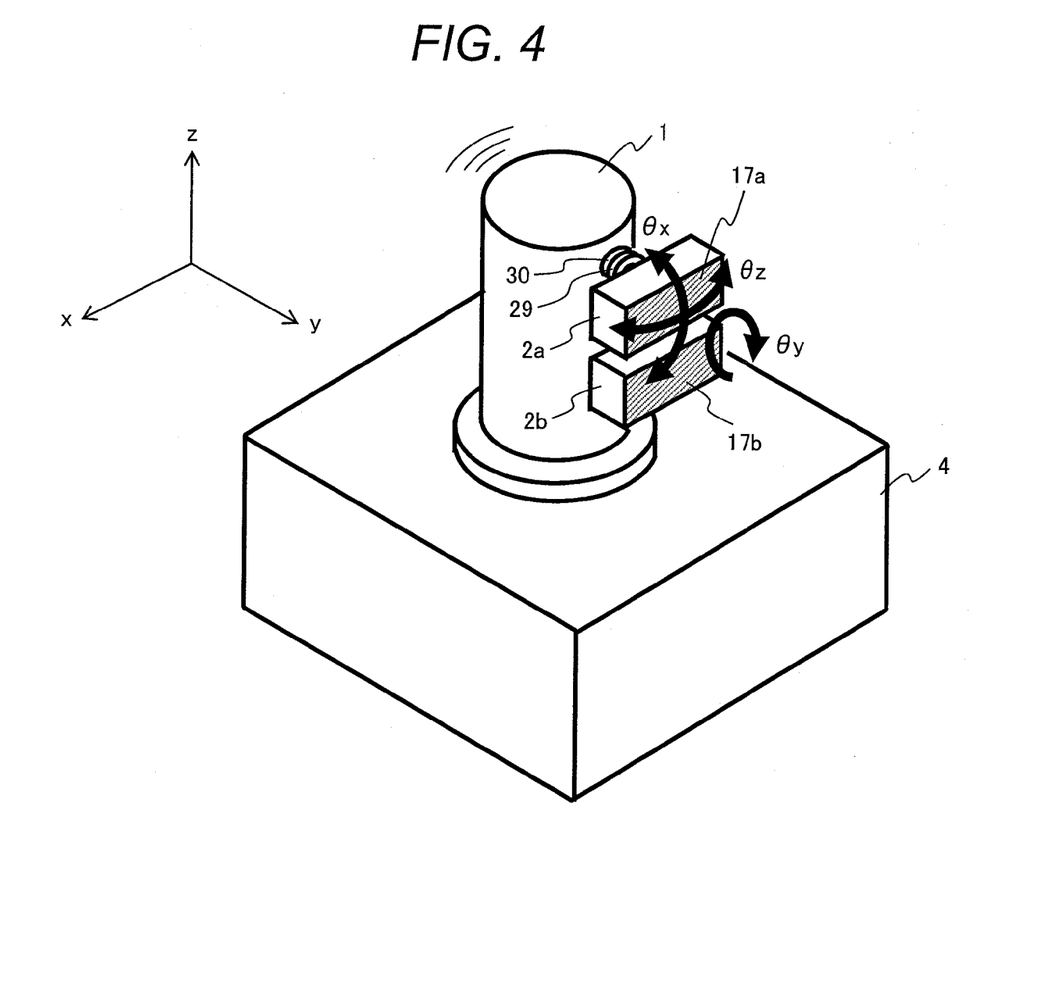
FIG. 4 shows the natural vibration modes of the ion pumps.

FIG. 4 shows the natural vibration modes of the ion pumps, obtained by the measurements. As noted in FIG. 4, ion pumps 2a and 2b are connected with an electron optical lens tube 1 through the intermediary of a flange 29, as is the case of the example of FIG. 2 where the ion pumps are attached to the charged particle radiation device. In FIG. 4, a frame 16 is not shown for the sake of clarity in description.

In the following description, a direction perpendicular to a pipe 30 for connecting the ion pumps 2a or 2b with the electron optical lens tube 1 and perpendicular to the electron optical lens tube 1 is designated as an x-direction, a direction parallel to the pipe 30 for connecting the ion pumps 2a or 2b with the electron optical lens tube 1 (a direction perpendicular to the flange 29) is designated as a y-direction, and a direction parallel to the electron optical lens tube 1 (vertical direction) is designated as a z-direction. Further, directions of rotation around the x, y, and z axes are indicated by θx, θy, and θz, respectively. Furthermore, the ion pumps 2a and 2b are assumed as a hexahedron, and each one of the faces thereof, which is opposite from the face connecting the flange 29, is designated as fitting face 17a or 17b (diagonally shaded areas in FIG. 4). The fitting faces 17a and 17b are parallel to an x-z plane.

According to results of the measurements of the natural vibration modes, rotation vibration in the respective directions of θx, θy, and θz, centering on a part of the ion pumps 2a and 2b, adjacent to flange 29, was found dominant as the natural vibration. It has been found out that angles of vibration in the respective directions of θx and θz are tiny, and therefore, the natural vibration mode of the ion pump is a mode in which the fitting face moves in the x-z plane. That is, it has been found out that the ion pump vibrates within the x-z plane, which is perpendicular to the pipe 30 for connecting the ion pumps 2a or 2b with the electron optical lens tube 1.

Accordingly, if a vibration absorber is disposed between the ion pump and the frame fixedly attached to the sample chamber, the vibration absorber comprising a layered structure including a viscoelastic sheet sandwiched between metal plates, thereby causing vibration energy of the ion pump to be absorbed by a viscoelastic body, the vibration of the ion pump can be quickly attenuated. More specifically, the layered structure for absorbing the vibration is disposed in the x-z plane so as to be parallel to the direction of the vibration of the ion pump.

As described above, in the present invention, the layered structure for absorbing the vibration is disposed in only one plane (the x-z plane) on the basis of a knowledge obtained from the results of the measurements of the natural vibration modes of the ion pump. Since the viscoelastic sheet is disposed so as to be parallel to the direction of the vibration of the ion pump, it is possible to effectively absorb the vibration energy and to rapidly reduce large strain (vibration displacement) and a strain rate (vibration velocity).

Hereinafter, vibration of the ion pump and a mechanism for absorption of the vibration energy by use of the viscoelastic body are described.

Vibration energy E of an ion pump can be calculated according the following expression from mass M of the ion pump and vibration velocity V, or from spring constant K corresponding to fitting rigidity of an ion pump and vibration displacement X of the ion pump:

$$E = \tfrac{1}{2}MV^2 = \tfrac{1}{2}KX^2.$$

The velocity V and the displacement X may be obtained from the natural angular frequency ωn and the absolute value A of acceleration of the ion pump. The spring constant K can be calculated from the natural angular frequency ωn and the mass M of the ion pump.

$$V = A/\omega n,$$

$$X = A/\omega n^2,$$

$$K = \omega n^2 M.$$

Figure 5A:
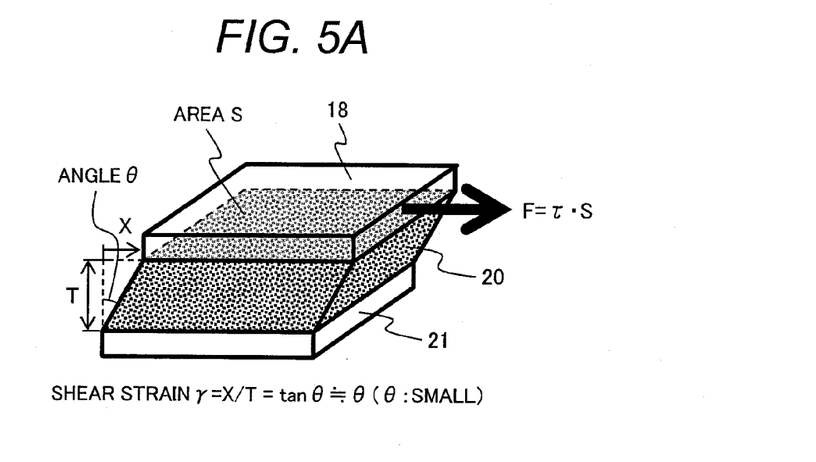
FIG. 5A shows a relationship between shear strain and displacement and a relationship between shear stress and a shearing force of a viscoelastic sheet.
Figure 5B:
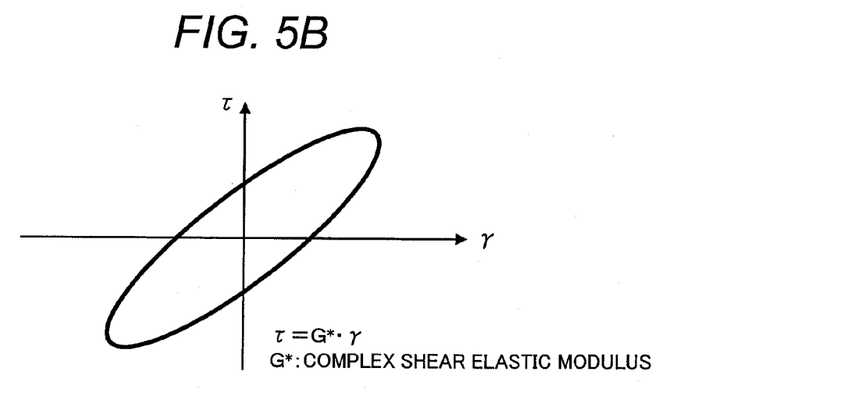
FIG. 5B shows a relationship between the shear strain and shear stress of the viscoelastic body.
Figure 5C:
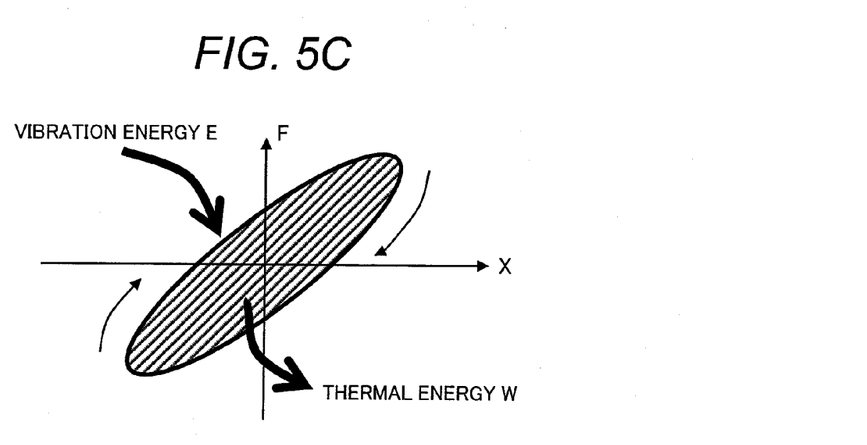
FIG. 5C shows a relationship between the displacement and shearing force of the viscoelastic body.

FIGS. 5A to 5C show the mechanism for absorption of vibration energy by the viscoelastic body.

FIG. 5A shows a relationship between shear strain and displacement, and a relationship between shear stress and a shearing force for a layered structure including a viscoelastic sheet and metal plates. The layered structure includes a viscoelastic sheet 20 having a thickness T and an area S, the viscoelastic sheet 20 being sandwiched between two metal plates 18 and 21.

As shown in FIG. 5A, suppose a force (shearing force) F is applied to the metal plate 18, the force F acting in a direction parallel to a contact plane between the metal plate 18 and the viscoelastic sheet 20. In this case, if an upper face of the viscoelastic sheet 20 is displaced by X over time t, shear strain γ and a shear strain rate (dγ/dt) will change, thereby causing shear stress τ to occur. Shear elastic modulus G* of the viscoelastic sheet 20 is expressed as the sum of shear stress G' (the real part) according to strain and shear stress G'' (the imaginary part) according to a strain rate (complex shear modulus G*=G'+G''j, j indicating an imaginary unit). That is, the constituent material itself of the viscoelastic sheet 20 can be regarded to include both a spring element and a damping element.

The shear stress τ is as large as the complex shear elastic modulus G* multiplied by the shear strain γ. Accordingly, the shear stress τ is represented by the following expression, G''/G' being referred to as a loss factor η:

$$\tau = G * Y$$
$$= (G' + G''j)Y$$
$$= G'(1 + \eta j)Y$$

where τ is shear stress, G* is complex shear elastic modulus, G' is the real part of complex shear elastic modulus (storage shear modulus), G'' is the imaginary part of complex shear elastic modulus (loss shear modulus), γ is shear strain, η is loss factor (=G''/G'), and j is an imaginary unit.

FIG. 5B shows a relationship between the shear strain γ and shear stress τ of a viscoelastic body. The relationship between the shear strain γ and the shear stress τ is represented by the expression τ=G*γ, and expressed by an ellipse instead of a straight line because the complex shear elastic modulus G* includes an imaginary term.

FIG. 5C shows a relationship between displacement X and the shearing force F of the viscoelastic body. The displacement X is calculated by multiplying the shear strain γ by the thickness T of the viscoelastic body, and the shearing force F is calculated by multiplying the shear stress τ by the area S of the viscoelastic body. An area of the ellipse indicates energy absorbed by the viscoelastic body when a forced displacement corresponding to one cycle is given to the viscoelastic body. More specifically, for the duration of one cycle of vibration, a portion of vibration energy E in an amount corresponding to the area of the ellipse is absorbed by the viscoelastic body to be converted into thermal energy W. This indicates a mechanism for absorption of vibration energy by the viscoelastic body.

The constituent material of the viscoelastic body can be selected from materials large in the loss factor η while temperature characteristics and frequency characteristics are considered. Specifically, loss factor η is in a range of 0.5 to 1.0 and preferably as large as 1.0.

As for a shape of the viscoelastic body, the thickness T of a viscoelastic sheet may be reduced to increase shear strain γ if vibration amplitude of an ion pump is tiny, while the area S may be increased if a damping force is to be increased. Accordingly, the viscoelastic body intended to suppress tiny vibration is in a shape of a sheet or a reed which is small in thickness and large in area. Respective values of the thickness T and the area S of the viscoelastic body are preferably decided such that the absorption energy of the viscoelastic body will be greater than the vibration energy E of the ion pump.

First Embodiment

Figure 1:
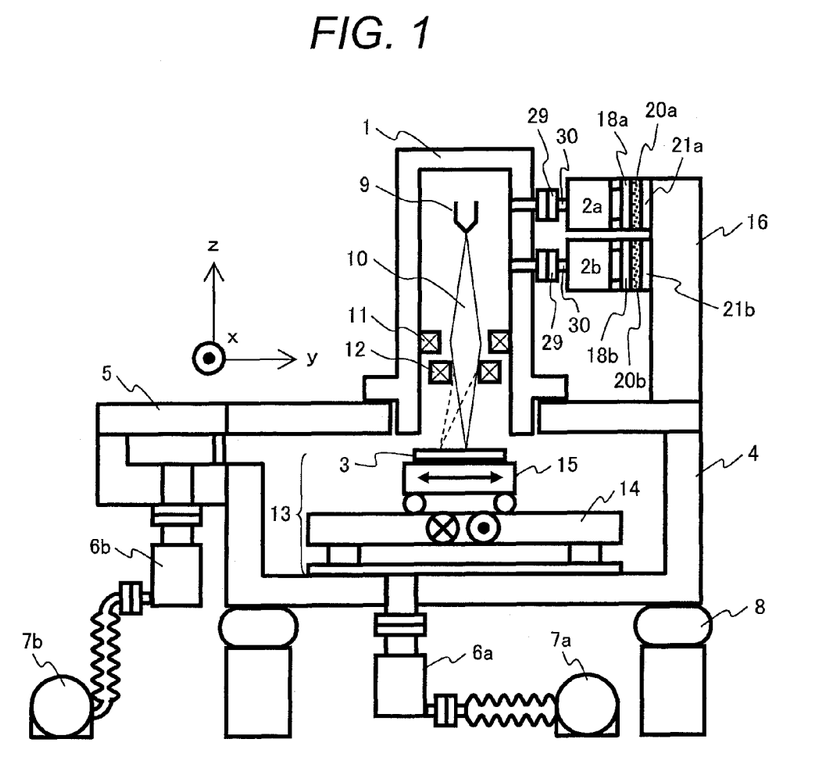
FIG. 1 is a schematic view showing a semiconductor inspection device according to a first embodiment of the invention.

A charged particle radiation device according to the first embodiment of the invention is described hereinafter by citing a semiconductor inspection device as an example. FIG. 1 is a schematic view showing a semiconductor inspection device according to the first embodiment of the invention.

An electron optical lens tube 1 of the semiconductor inspection device is evacuated by two units of ion pumps 2a and 2b, and an ultra-high vacuum state is maintained inside the electron optical lens tube 1. A stage 13 with a sample 3 mounted thereon moves inside a sample chamber 4. The sample chamber 4 is evacuated by a turbo-molecular pump 6a and a roughing vacuum pump 7a. A load lock chamber 5 for delivering the sample 3 to the outside device is also evacuated by the turbo-molecular pump 6b and the roughing vacuum pump 7b.

A damping mount 8 attenuates the vibration propagating from the floor to the semiconductor inspection device.

An electron beam 10 emitted from an electron gun 9 is converged by an objective lens 11 and scanned by a deflection lens 12 to irradiate the sample 3. Then, a secondary electron and a reflection electron are detected to acquire an observation image of the sample 3.

The stage 13 includes movable bodies such as an X-stage 14 and a Y-stage 15.

Figure 6:
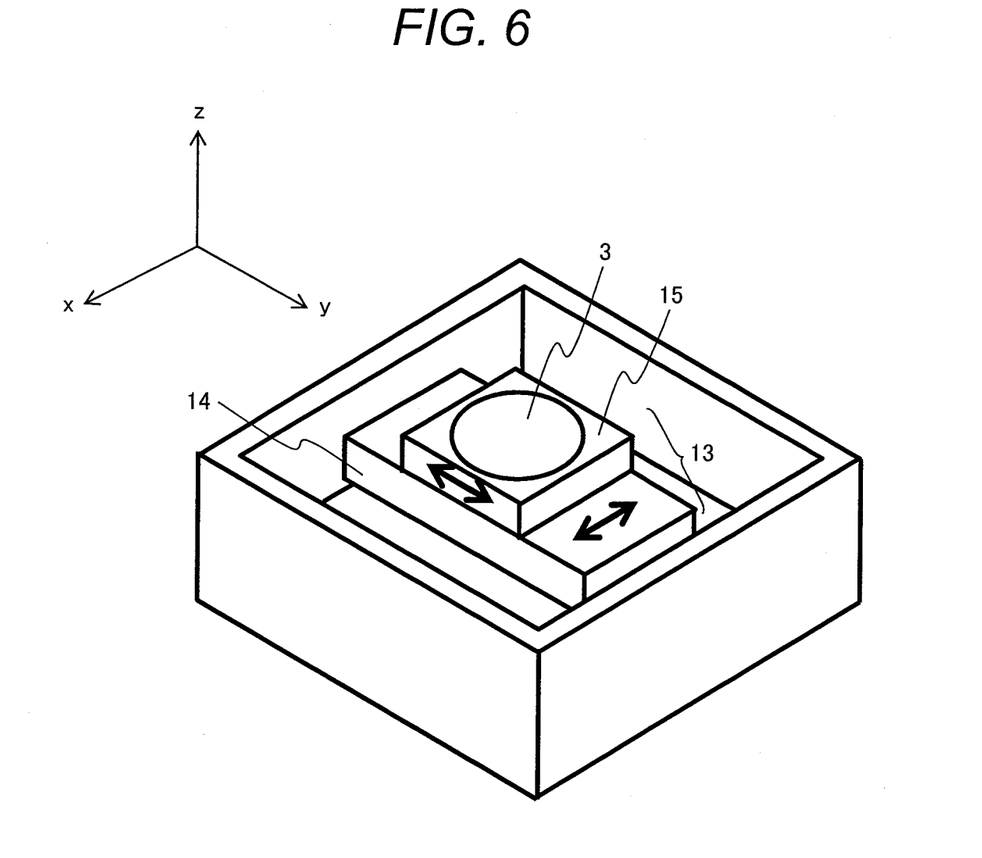
FIG. 6 shows an example of a structure of a stage.

FIG. 6 shows an example of a structure of the stage 13. As shown in FIG. 6, the X-stage 14 is movable in the x-direction, and the Y-stage 15 is movable in the y-direction. Thus, the stage 13 is configured to be driven in two dimensions in order to observe the whole surface of the sample 3.

Mounting of the ion pumps 2a and 2b, a frame 16, and a layered structure including a viscoelastic sheet sandwiched between metal plates is described hereinafter with reference to FIG. 7.

Figure 7:
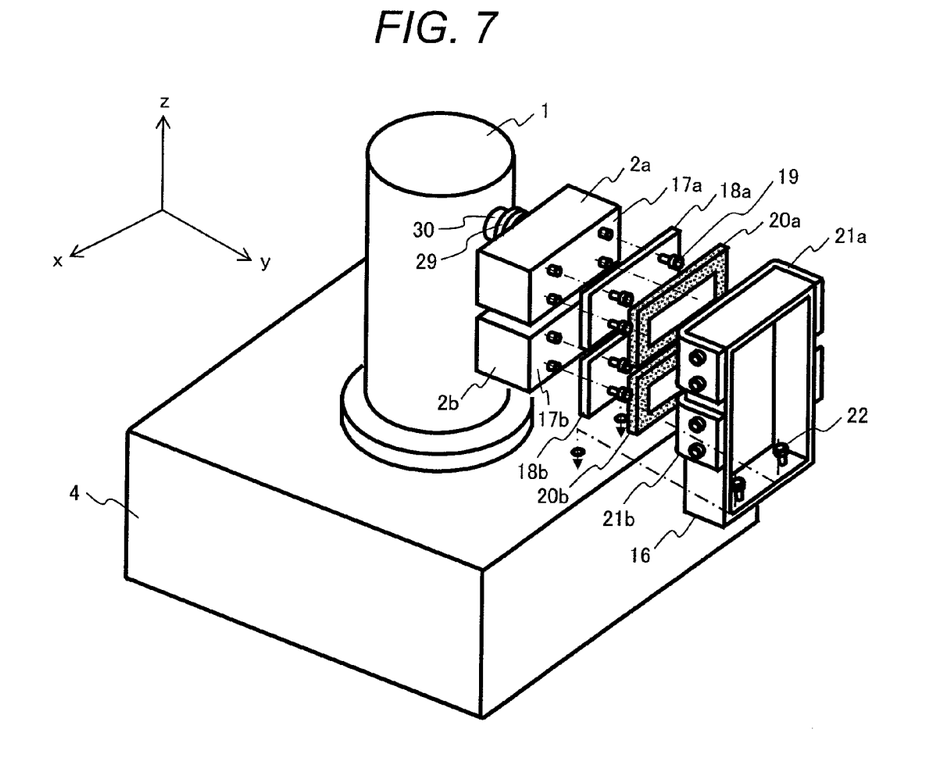
FIG. 7 is a view depicting an implementation of the viscoelastic sheet in accordance with the first embodiment of the invention.

FIG. 7 is a view depicting an implementation of the viscoelastic sheet. Metal plates 18a and 18b are fixed to respective fitting faces 17a and 17b of the ion pumps 2a and 2b with the use of bolts 19, the ion pumps 2a and 2b being attached to the electron optical lens tube 1. Viscoelastic sheets 20a and 20b are attached to respective faces of the metal plates 18a and 18b, the respective faces thereof are opposite from the faces connecting the ion pumps 2a and 2b. Metal plates 21a and 21b are attached to respective faces of the viscoelastic sheets 20a and 20b, the respective faces thereof being opposite from the faces connecting the metal plates 18a and 18b. The metal plates 21a and 21b are fixedly attached to the frame 16. The frame 16 is fixedly attached to the sample chamber 4 with the use of bolts 22. The layered structure mounted in such a way as described above can be removed at the time of baking.

The ion pumps 2a and 2b are connected with the electron optical lens tube 1 through the intermediary of a pipe 30, fastened by a flange 29, the pipe 30 being attached to the electron optical lens tube 1 by welding. Accordingly, the respective attachment positions of the ion pumps 2a and 2b to the electron optical lens tube 1 will have an error of around ±1 mm. However, the layered structure can be mounted as follows to cancel out the error. Holes through which the bolts 19 are passed are formed into round holes or oval holes larger in diameter than a thread diameter of the bolts. In this way, the respective attachment positions of the metal plates 18a and 18b to the ion pumps can be finely adjusted in the x, y and z directions, respectively. Further, by adjusting respective attachment angles of the metal plates 21a and 21b to the frame 16, angles of rotation around the x-axis and the y-axis, respectively, can be adjusted. Deviation in an angle of rotation around the z-axis is absorbed by the viscoelastic sheets 20.

Elastic modulus (200 kPa) of each of the viscoelastic sheets 20a and 20b is on the order of one millionths of elastic modulus (200 GPa) of a stainless steel, which is a constituent material of the metal plates 18a and 18b adjacent to the ion pumps and is a constituent material of the metal plates 21a and 21b adjacent to the frame. In consequence, even if the layered structure undergoes thermal expansion in the direction of arrows shown in FIG. 8, a repulsion force of each of the viscoelastic sheets 20a and 20b is so small, and therefore there will be little likelihood of occurrence of a loop of force formed by the sample chamber 4, the frame 16, the ion pumps 2a and 2b, and the electron optical lens tube 1. That is, an effect of deformation of the layered structure due to the thermal expansion can be reduced, thereby preventing a change in the position of the irradiation with the electron beam.

Figure 8:
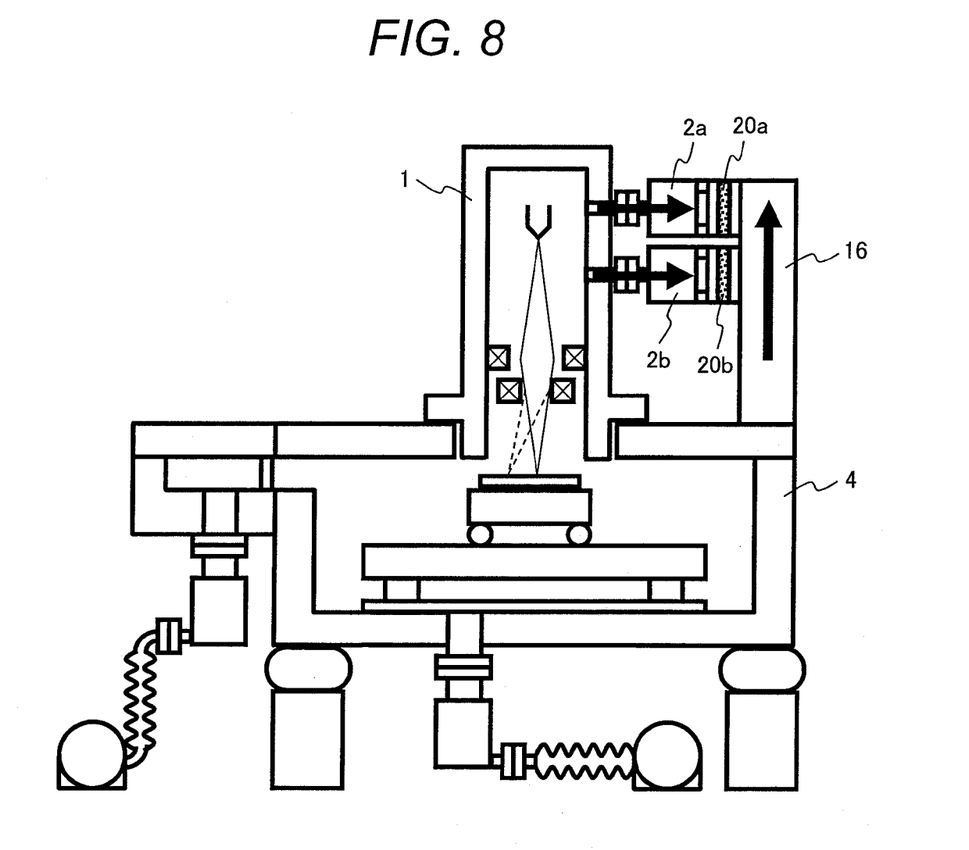
FIG. 8 shows a direction in which a structure of the semiconductor inspection device undergoes thermal expansion.

Further, if each of the viscoelastic sheets 20a and 20b is made of an insulating material, no current will flow through the loop formed by the sample chamber 4, the frame 16, the ion pumps 2a and 2b, and the electron optical lens tube 1, so that the loop of current will not occur. For this reason, it is possible to reduce swing of an electron beam, which occurs in synchronization with a power supply, such as a change in the earth potential, and so forth.

As the viscoelastic sheets 20a and 20b are unable to withstand a baking temperature for the ion pumps 2a and 2b, it is necessary to remove the layered structure at the time of baking. A fire-resistant material can be selected for the viscoelastic sheets 20a and 20b for a safety precaution.

Second Embodiment

Figure 9:
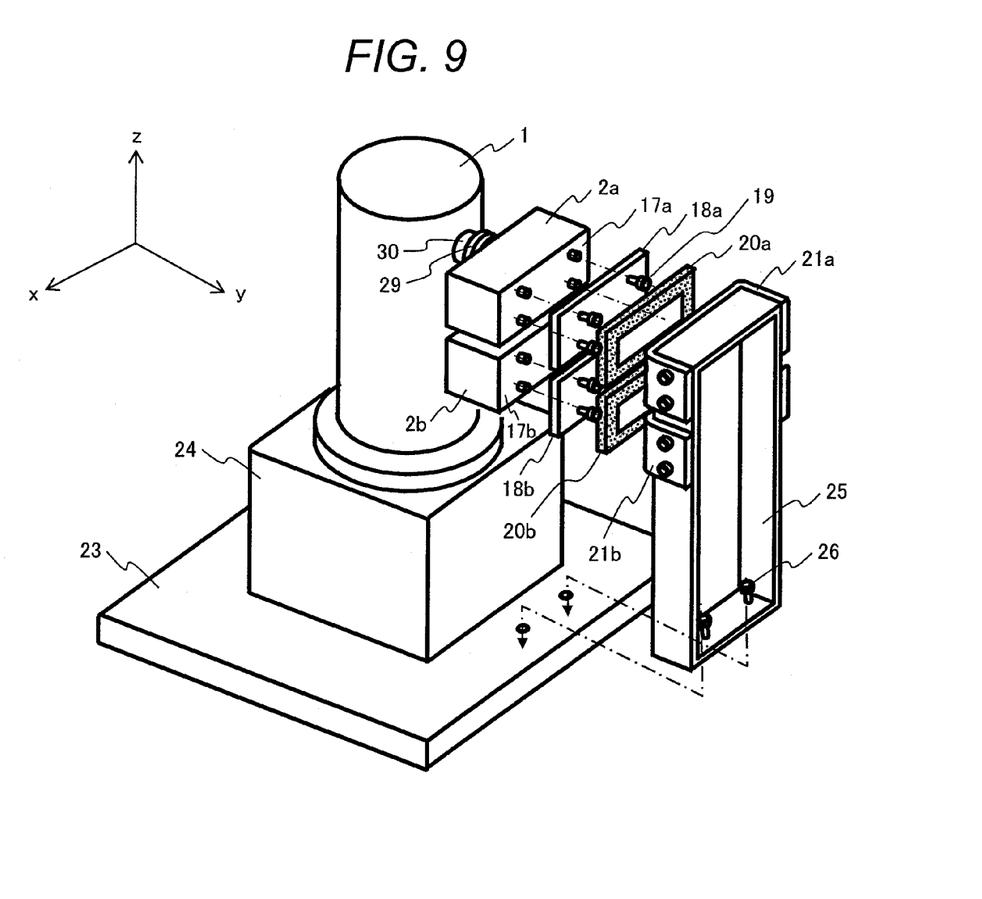
FIG. 9 is a schematic view showing a scanning electron microscope according to a second embodiment of the invention.

A charged particle radiation device according to the second embodiment of the invention is described hereinafter by citing a scanning electron microscope as an example. FIG. 9 is a schematic view showing a scanning electron microscope according to the second embodiment of the invention.

While the semiconductor inspection device according to the first embodiment, shown in FIG. 1, is a device for use in observation of a sample large in diameter, the scanning electron microscope shown in FIG. 9 is a device for use in observation of a sample small in size. Accordingly, a sample chamber 24 is small and is mounted on a load plate 23. The load plate 23 is a plate-shaped member for supporting the sample chamber 24 and installed over a damping mount (not shown) for blocking vibration from the floor.

A method for attaching ion pumps 2a and 2b to an electron optical lens tube 1, and methods for attaching metal plates 18a and 18b, viscoelastic sheets 20a and 20b, and metal plates 21a and 21b are the same as those described in the first embodiment. The metal plates 21a and 21b are fixedly attached to a frame 25 as is the case with the first embodiment, except that the frame 25 is fixedly attached to the load plate 23 by use of bolts 26.

In such a configuration as described, a reaction force of stage-driving, floor vibration propagated from the floor to the load plate 23 without attenuation, and the rotation vibration of a roughing vacuum pump are considered as a vibration source for each of the ion pumps 2a and 2b.

In the present embodiment, the vibration energy of the ion pumps 2a and 2b can be absorbed by the viscoelastic sheets 20a and 20b, thereby enabling the vibration of the ion pumps 2a and 2b to be quickly attenuated, as is the case with the first embodiment. Further, it is also possible to prevent occurrence of the loop of force and the loop of current, as is the case with the first embodiment.

Third Embodiment

Figure 10:
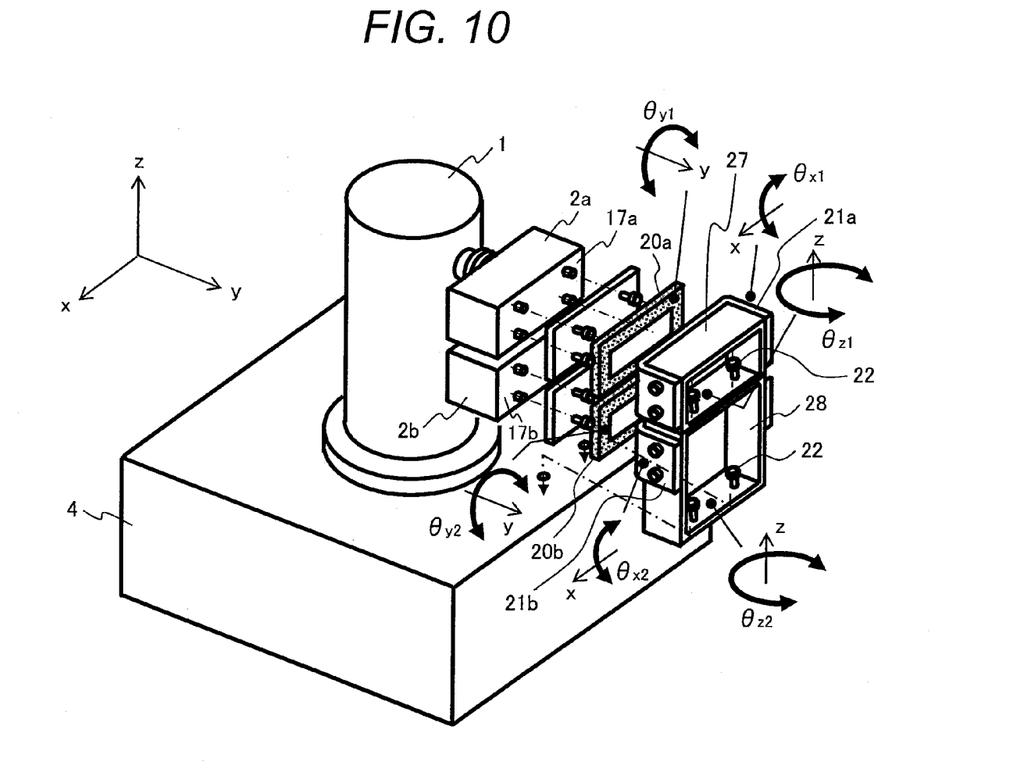
FIG. 10 is a schematic view showing a semiconductor inspection device according to a third embodiment of the invention.

A charged particle radiation device according to the third embodiment of the invention is described hereinafter by citing a semiconductor inspection device as an example, as is the case with the first embodiment. FIG. 10 is a schematic view showing a semiconductor inspection device according to the third embodiment of the invention.

Even in the configuration of the semiconductor inspection device according to the first embodiment, the angles of rotation around the x-axis, y-axis, and z-axis can be adjusted, respectively. The fitting faces 17a and 17b of the ion pumps 2a and 2b, respectively, are ideally to be parallel to the x-z plane. However, since the ion pumps 2a and 2b are attached to the electron optical lens tube 1 by welding as previously described, the fitting faces 17a and 17b are not exactly aligned with each other in respect of position and orientation, and the fitting faces 17a and 17b are occasionally oriented in differing directions from each other. That is, there can be a case where the fitting faces 17a and 17b are not parallel to each other. In such a case, the viscoelastic sheets 20a and 20b will not be parallel to each other, either.

If the two pieces of the viscoelastic sheets 20a and 20b that are not parallel to each other are fixed to the metal plates 21a and 21b attached to one piece of the frame 16 (refer to FIG. 7), the viscoelastic sheets 20a and 20b will be uneven in thickness because the metal plates 21a and 21b are in one and the same plane and are parallel to each other. Particularly, in the case that the viscoelastic sheets 20a and 20b have a thickness as small as on the order of 1 mm, there can be a possibility that, for example, vibration from the frame 16 is propagated to the ion pumps 2a and 2b without the agency of the viscoelastic sheets 20a and 20b, so that the expected effect of vibration suppression cannot be obtained.

Accordingly, a configuration is preferable that the metal plate 21a is parallel to the viscoelastic sheet 20a and concurrently the metal plate 21b is parallel to the viscoelastic sheet 20b. In other words, it is preferable that the metal plates 21a and 21b can be oriented in differing directions from each other and can be adjusted to coincide with the directions of the ion pumps 2a and 2b, respectively.

Therefore, in the present embodiment, the frame in the semiconductor inspection device according to the first embodiment is split into two pieces, namely, an upper frame 27 and a lower frame 28, so that the upper frame 27 and the lower frame 28 can be oriented in differing directions from each other, as shown in FIG. 10. The metal plate 21a is fixedly attached to the upper frame 27, and the metal plate 21b is fixedly attached to the lower frame 28. The upper frame 27 is fixedly attached to the lower frame 28 by use of bolts 22, and the lower frame 28 is fixedly attached to the sample chamber 4 by use of bolts 22. Holes through which the bolts 22 are passed are formed into round holes or oval holes larger in diameter than a thread diameter of the bolts. In this way, it is possible to independently adjust the respective attachment angles of the upper frame 27 and the lower frame 28.

The upper frame 27 is fixed after adjusting the respective angles $\theta x1$, $\theta y1$, and $\theta z1$ so that the fitting face 17a of the ion pump 2a is parallel to the metal plate 21a. The lower frame 28 is fixed after adjusting the respective angles $\theta x2$, $\theta y2$, and $\theta z2$ so that the fitting face 17b of the ion pump 2b is parallel to the metal plate 21b. The angles $\theta x1$ and $\theta x2$ refer to angles around the x-axis, the angles $\theta y1$ and $\theta y2$ refer to angles around the y-axis, and the angles $\theta z1$ and $\theta z2$ refer to angles around the z-axis.

In such a configuration as described above, even if the two ion pumps 2a and 2b are not coincided in orientation with each other and the fitting faces 17a and 17b are not parallel to each other, it is possible to attach the viscoelastic sheets 20a and 20b, adjusted to coincide with the directions of the respective ion pumps 2a and 2b and to be parallel with the respective fitting faces 17a and 17b. Accordingly, vibration energy of each of the ion pumps 2a and 2b can be absorbed by the viscoelastic sheets 20a and 20b, respectively, and the vibration of each of the ion pumps 2a and 2b can be quickly and reliably attenuated.

In the present embodiment of the invention, the semiconductor inspection device is cited as an example, as is the case with the first embodiment, and therefore, the lower frame 28 is fixedly attached to the sample chamber 4. If the present embodiment of the invention is applied to the scanning electron microscope, as is the case with the second embodiment, the lower frame 28 is fixedly attached to the load plate 23.

As described with reference to those embodiments as above, the present invention can provide a charged particle radiation device high in resolution and high in throughput, capable of attenuating the natural vibration of an ion pump in a short time and preventing occurrence of a loop of force and a loop of current.

Further, in those embodiments described above, examples of the charged particle radiation device having two ion pumps are described. However, it is to be understood that the number of ion pumps is not limited to two. A layered structure or layered structures including a viscoelastic sheet sandwiched between the metal plates may be prepared, the number of the layered structure or layered structures being decided according to the number of an ion pump or ion pumps, and each of the layered structure or layered structures is mounted onto the ion pump or ion pumps, respectively. In the case of the third embodiment, when the number of the ion pumps is three or more, the frame may be split to correspond with the number of the ion pumps, and the layered structures are attached to the respective split frames to be mounted onto the respective ion pumps.

DESCRIPTION OF THE REFERENCE NUMERALS

1: electron optical lens tube
2a, 2b: ion pump
3: sample
4: sample chamber
5: load lock chamber
6a, 6b: turbo-molecular pump
7a, 7b: roughing vacuum pump
8: damping mount
9: electron gun
10: electron beam
11: objective lens
12: deflection lens
13: stage
14: X-stage
15: Y-stage
16: frame
17a, 17b: fitting face (of the ion pump)
18, 18a, 18b, 21, 21a, 21b: metal plate
19, 22, 26: bolt
20, 20a, 20b: viscoelastic sheet
23: load plate
24: sample chamber
25: frame
27: upper frame
28: lower frame
29: flange
30: pipe

What is claimed is:

1. A charged particle radiation device comprising:
a sample chamber configured for disposing a sample therein;
a charged particle radiation optical lens tube configured to irradiate the sample with charged particle radiation;
an ion pump having an outer surface and configured to evacuate an interior of the charged particle radiation optical lens tube;
a frame fixedly attached to a constituent member of the sample chamber, the frame facing a fitting face of the outer surface of the ion pump; and
a vibration absorber provided outside the outer surface of the ion pump between the frame and the fitting face of the outer surface of the ion pump, the vibration absorber configured to be removable from the outer surface of the ion pump and comprising a layered structure which includes a viscoelastic sheet sandwiched between metal plates.

2. The charged particle radiation device according to claim 1, comprising a plurality of ion pumps each having an outer surface,
wherein the frame is split into plural frames, the number of the split frames corresponding with the number of the ion pumps,
each of the split frames is fixedly attached to a constituent member of the sample chamber or to another frame, and
the layered structure is provided between each of the split frames and each of the ion pumps outside the outer surfaces of the ion pumps.

3. The charged particle radiation device according to claim 1,
wherein the vibration absorber is disposed in only one plane of the ion pump.

4. The charged particle radiation device according to claim 3,
wherein the fitting face of the outer surface of the ion pump is on a side of the ion pump opposite to a side of the ion pump that faces the charged particle radiation optical lens tube.

5. A charged particle radiation device comprising:
a sample chamber configured for disposing a sample therein;
a load plate configured to support the sample chamber;
a charged particle radiation optical lens tube configured to irradiate the sample with charged particle radiation;
an ion pump having an outer surface and configured to evacuate an interior of the charged particle radiation optical lens tube;
a frame fixedly attached to the load plate, the frame facing a fitting face of the outer surface of the ion pump; and
a vibration absorber provided outside the outer surface of the ion pump between the frame and the fitting face of the outer surface of the ion pump, the vibration absorber configured to be removable from the outer surface of the ion pump and comprising a layered structure which includes a viscoelastic sheet sandwiched between metal plates.

6. The charged particle radiation device according to claim 5, comprising a plurality of ion pumps each having an outer surface,
wherein the frame is split into plural frames, the number of the split frames corresponding with the number of the ion pumps,
each of the split frames is fixedly attached to the load plate or to another frame, and
the layered structure is provided between each of the split frames and each of the ion pumps outside the outer surfaces of the ion pumps.

* * * * *